United States Patent
Lee et al.

(10) Patent No.: US 9,336,883 B2
(45) Date of Patent: May 10, 2016

(54) SEMICONDUCTOR MEMORY DEVICE AND METHOD OF OPERATING THE SAME

(75) Inventors: Jae Ho Lee, Icheon-si (KR); Jin Su Park, Daegu (KR)

(73) Assignee: SK HYNIX INC., Icheon-si, Gyeonggi-do (KR)

( * ) Notice: Subject to any disclaimer, the term of this patent is extended or adjusted under 35 U.S.C. 154(b) by 0 days.

(21) Appl. No.: 13/594,624

(22) Filed: Aug. 24, 2012

(65) Prior Publication Data

US 2013/0051152 A1    Feb. 28, 2013

(30) Foreign Application Priority Data

Aug. 25, 2011 (KR) .................... 10-2011-0085085

(51) Int. Cl.
| | |
|---|---|
| G11C 11/34 | (2006.01) |
| G11C 16/04 | (2006.01) |
| G11C 16/32 | (2006.01) |
| G11C 16/34 | (2006.01) |

(52) U.S. Cl.
CPC ............ G11C 16/0483 (2013.01); G11C 16/32 (2013.01); G11C 16/3418 (2013.01)

(58) Field of Classification Search
USPC ...................................................... 365/185.1
See application file for complete search history.

(56) References Cited

U.S. PATENT DOCUMENTS

| | | | | |
|---|---|---|---|---|
| 2005/0213385 | A1* | 9/2005 | Hosono | G11C 16/08 365/185.17 |
| 2006/0018162 | A1* | 1/2006 | Kawai | G11C 16/12 365/185.28 |
| 2006/0245251 | A1* | 11/2006 | Shirota | G11C 16/0483 365/185.17 |
| 2008/0198667 | A1* | 8/2008 | Hosomura | G11C 16/3418 365/185.25 |
| 2010/0182844 | A1* | 7/2010 | Han | G11C 16/3454 365/185.22 |
| 2011/0188314 | A1* | 8/2011 | Kuo | G11C 5/14 365/185.18 |
| 2011/0235392 | A1* | 9/2011 | Kawaguchi | G11C 8/08 365/148 |
| 2012/0081961 | A1* | 4/2012 | Yoon | G11C 16/3459 365/185.12 |
| 2012/0268996 | A1* | 10/2012 | Park | G11C 7/02 365/185.12 |

FOREIGN PATENT DOCUMENTS

| | | |
|---|---|---|
| KR | 1020080035352 A | 4/2008 |
| KR | 1020080040489 A | 5/2008 |

* cited by examiner

*Primary Examiner* — Hoai V Ho
*Assistant Examiner* — Pablo Huerta
(74) *Attorney, Agent, or Firm* — William Park & Associates Ltd.

(57) ABSTRACT

A method of operating a semiconductor memory device includes, applying a read voltage to a selected word line to which a selected memory cell is coupled and applying a pass voltage to non-selected word lines to which non-selected memory cells are coupled, reading data stored in the selected memory cell by sensing the voltage of a bit line associated with the selected memory cell and the non-selected memory cells, discharging the non-selected word lines, and discharging the selected word line after the non-selected word lines are discharged.

12 Claims, 9 Drawing Sheets

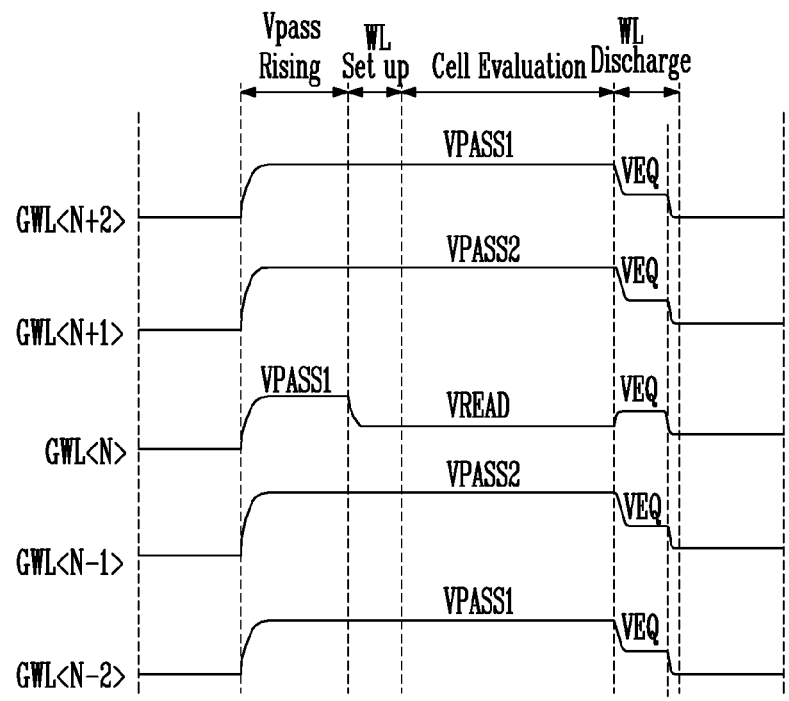

SEMICONDUCTOR MEMORY DEVICE AND METHOD OF OPERATING THE SAME

CROSS-REFERENCE TO RELATED APPLICATION

Priority is claimed to Korean patent application number 10-2011-0085085 filed on Aug. 25, 2011, the entire disclosure of which is incorporated by reference.

BACKGROUND

Exemplary embodiments relate generally to a semiconductor memory device and, more particularly, to a semiconductor memory device and a method of operating the same, which can influence capacitive coupling between word lines.

High-capacity semiconductor memory such as, for example, NAND flash memory has been in the spotlight due to its potential for replacing a hard disk drive. The NAND flash memory device is characterized in that it facilitates high capacity and high degree of integration and retains information even when power is not supplied to the NAND flash memory device. The memory cell of the NAND flash memory device has a dual gate structure including a floating gate and a control gate. Data is stored or erased in the memory cell due to electrons going to or from the floating gate using an FN tunneling effect according to a potential difference between the control gate and a channel body.

The control gate is coupled to a word line and controlled in response to voltage supplied to the word line. The channel is coupled to a bit line and configured to control a channel voltage by controlling the voltage of the bit line. The NAND flash memory device performs a program operation of storing data in memory cells by controlling the voltages of a word line and bit lines. The threshold voltage of the memory cell is shifted according to the number of electrons stored in the floating gate, and data is stored in the floating gate using the shifted threshold voltage.

The voltage of a local word line coupled to the memory cell is controlled using a global word line. The voltage of the local word line is controlled by a word line precharge operation of transferring a high voltage to the local word line and a word line discharge operation of changing the voltage of the local word line to a low voltage. Almost all the operations of the NAND flash memory device include the word line precharge and the word line discharge operation.

A read operation of the NAND flash memory device is a very basic operation, and used often. If there is a problem in the read operation, the problem has a great effect on the NAND flash memory device. The word line discharge operation in the read operation is very important. If voltage supplied to a word line coupled to a memory cell to be read is low, the voltage of the word line is greatly influenced by the voltages of surrounding word lines. This effect is greater in the word line discharge operation than in the word line precharge operation. This phenomenon is generated by capacitive coupling between the word lines. Consequently, the word line discharge operation in the read operation has a great effect on the threshold voltage distribution of the memory cells.

Accordingly, there is a need for a method of preventing a change in the threshold voltage distribution of memory cells that may be generated in the word line discharge operation during the read operation.

BRIEF SUMMARY

Exemplary embodiments relate to preventing a soft erasure (or hole injection) phenomenon that may be generated due to capacitive coupling between word lines in a word line discharge operation during read/verify operations.

A method of operating a semiconductor memory device according to an aspect of the present disclosure includes applying a read voltage to a selected word line to which a selected memory cell is coupled and applying a pass voltage to non-selected word lines to which non-selected memory cells are coupled, reading data stored in the selected memory cell by sensing a voltage of a bit line associated with the selected memory cell and the non-selected memory cells, discharging the non-selected word lines, and discharging the selected word line after the non-selected word lines are discharged.

A method of operating a semiconductor memory device according to another aspect of the present disclosure includes applying a read voltage to a selected word line to which a selected memory cell is coupled and applying a pass voltage to non-selected word lines to which non-selected memory cells are coupled, reading data stored in the selected memory cell by sensing a voltage of a bit line associated with the selected memory cell and the non-selected memory cells, raising the voltage of the selected word line up to the pass voltage, and discharging all the word lines.

A method of operating a semiconductor memory device according to yet another aspect of the present disclosure includes applying a read voltage to a selected word line to which a selected memory cell is coupled and applying a pass voltage to non-selected word lines to which non-selected memory cells are coupled, reading data stored in the selected memory cell by sensing a voltage of a bit line associated with the selected memory cell and the non-selected memory cells, changing voltages of all the word lines to a predetermined level, discharging all the word lines.

A semiconductor memory device according to still yet another aspect of the present disclosure includes memory cell blocks comprising a plurality of memory cells, a voltage supply circuit configured to supply a selected voltage to a selected global word line to which a selected memory cell of the memory cells is coupled, supply a non-selected voltage to non-selected global word lines to which non-selected memory cells of the memory cells are coupled in a read operation, and supply a ground voltage to all the global word lines in a word line discharge operation, in response to control signals, a control circuit configured to control the voltage supply circuit by generating the control signals so that the non-selected global word lines are discharged and then the selected global word line is discharged in the word line discharge operation.

A semiconductor memory device according to still yet another aspect of the present disclosure includes memory cell blocks comprising a plurality of memory cells, a voltage supply circuit configured to supply a selected voltage to a selected global word line to which a selected memory cell of the memory cells is coupled, supply a non-selected voltage to non-selected global word lines to which non-selected memory cells of the memory cells are coupled in a read operation, and supply a ground voltage to all the global word lines in a word line discharge operation, in response to control signals, a control circuit configured to control the voltage supply circuit by generating the control signals so that a voltage of the selected global word line is raised up to the non-selected voltage and all the global word lines are then discharged in the word line discharge operation.

A semiconductor memory device according to still yet another aspect of the present disclosure includes memory cell blocks comprising a plurality of memory cells, a voltage supply circuit configured to supply a selected voltage to a selected global word line to which a selected memory cell of the memory cells is coupled, supply a non-selected voltage to non-selected global word lines to which non-selected memory cells of the memory cells are coupled in a read operation, and supply a ground voltage to all the global word lines in a word line discharge operation, in response to control signals, a control circuit configured to control the voltage supply circuit by generating the control signals so that all the global word lines are discharged after voltages of all the global word lines are changed to a predetermined voltage in the word line discharge operation.

A semiconductor memory device according to still yet another aspect of the present disclosure includes a memory array comprising a plurality of memory cells coupled to a plurality of word lines, and a discharge circuit configured to discharge non-selected word lines among the plurality of word lines at a first timing and to discharge a selected word line at a second timing during the read operation.

A semiconductor memory device according to still yet another aspect of the present disclosure includes a memory array comprising a plurality of memory cells coupled to a plurality of word lines, a voltage supply circuit configured to apply a read voltage to a selected word line and a pass voltage to non-selected word lines at a first timing during a read operation of the memory cells, and a discharge circuit configured to discharge all the word lines at a second timing during the read operation, the voltage supply circuit applies the pass voltage to the selected word line so that the voltage of the selected word line is raised up to the pass voltage at the second timing.

A semiconductor memory device according to still yet another aspect of the present disclosure includes a memory array comprising a plurality of memory cells coupled to a plurality of word lines, a voltage supply circuit configured to apply a read voltage to a selected word line and a pass voltage to non-selected word lines at a first timing during a read operation of the memory cells, and a discharge circuit configured to discharge all the word lines at a second timing during the read operation, the voltage supply circuit applies a predetermined voltage to the selected word line so that the voltage of all the word lines is raised up to the predetermined voltage at the second timing.

BRIEF DESCRIPTION OF THE DRAWINGS

FIG. 12 is a timing diagram illustrating an exemplary method of operating the semiconductor memory device according to a fourth embodiment of this disclosure.

DESCRIPTION OF EMBODIMENTS

Some exemplary embodiments of the present invention will be described in detail with reference to the accompanying drawings. The figures are provided to allow those having ordinary skill in the art to understand the scope of the embodiments of the disclosure.

Throughout this specification and the claims that follow, when it is described that one element is "coupled (or connected)" to the other element, the one element may be "directly coupled (or connected)" to the other element or "electrically coupled (or connected)" to the other element through a third element.

Furthermore, when it is said in the specification that any part is "on" any constituent elements, it means the part is placed on top of or under the constituent elements. Furthermore, a term, such as " . . . unit," " . . . device," or "module" refers to a unit for processing at least one function or operation, and it may be implemented by hardware, software, or a combination of hardware and software.

Figure 1:
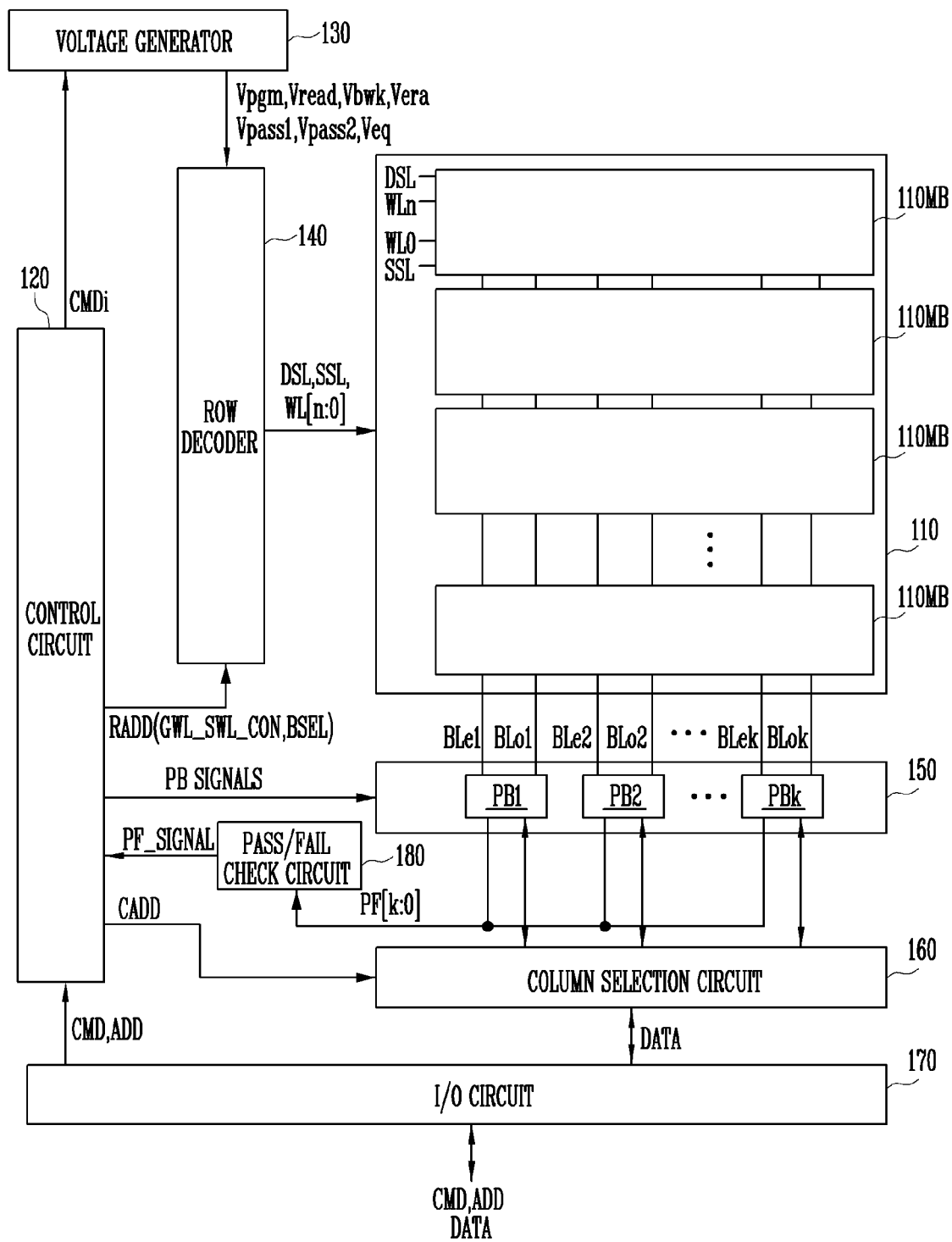
FIG. 1 is a block diagram illustrating a semiconductor memory device according to an exemplary embodiment of this disclosure.
Figure 2:
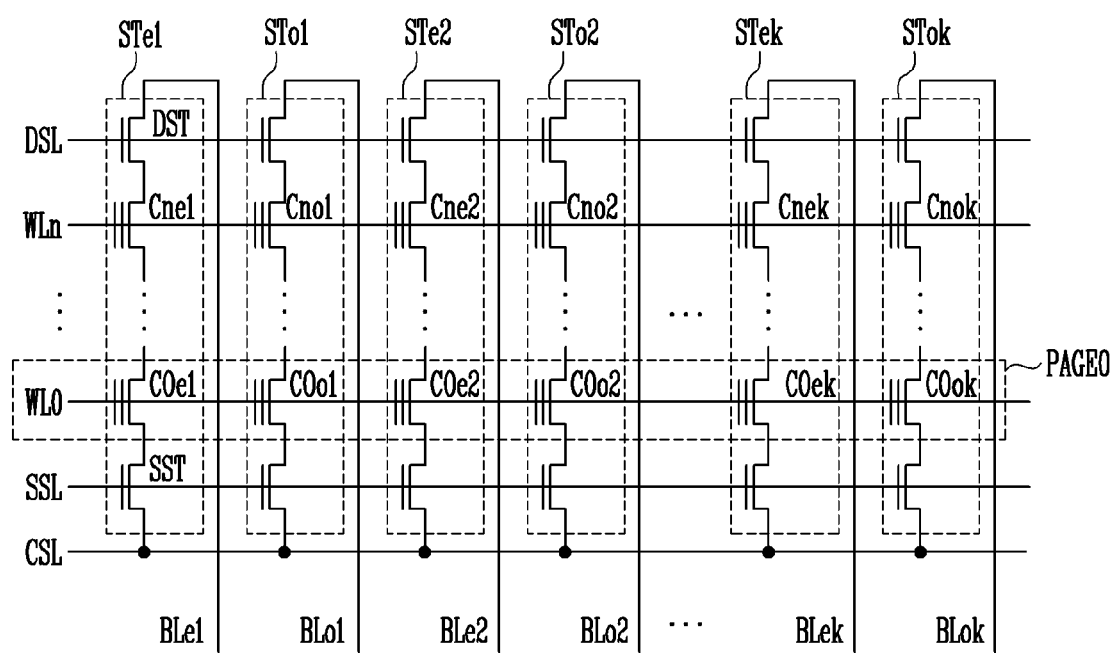
FIG. 2 is a circuit diagram illustrating a memory cell block shown in FIG. 1.

FIG. 1 is a block diagram illustrating a semiconductor memory device according to an exemplary embodiment of this disclosure. FIG. 2 is a circuit diagram illustrating an exemplary memory cell block shown in FIG. 1.

The semiconductor memory device according to the exemplary embodiment of this disclosure includes a memory array 110 configured to include a plurality of memory cell blocks 110 MB, an operation circuit (130, 140, 150, 160, 170, and 180) configured to perform a program operation, a read operation, and a test operation for the memory cells of a page selected from the memory cell block 110 MB, and a control circuit 120 configured to control the operation circuit (130, 140, 150, 160, 170, and 180). In a NAND flash memory device, the operation circuit includes a voltage supply circuit (130, 140), page buffer groups 150, a column selection circuit 160, an I/O circuit 170, and a pass/fail check circuit 180.

The memory array 110 includes the plurality of memory cell blocks 110 MB.

Referring to FIG. 2, each of the memory cell blocks 110B (FIG. 1) includes a plurality of strings STe1 to STek and STo1 to STok coupled between bit lines BLe1 to BLek and BLo1 to BLok, respectively, and a common source line CSL. That is, the strings ST1 to ST2*k* are coupled to the respective bit lines BL1 to BL2*k* and in common coupled to the common source line CSL. An exemplary string such as, for example, STe1, includes a source selection transistor SST having a source coupled to the common source line CSL, a plurality of memory cells C0*e*1 to Cn*e*1, and a drain selection transistor DST having a drain coupled to the bit line BLe1. The memory cells C0*e*1 to Cn*e*1 are coupled in series between the selection transistors SST and DST. The gate of the source selection transistor SST is coupled to a source selection line SSL. The gates of the memory cells C0e1 to Cne1 are coupled to respective word lines WL0 to WLn. The gate of the drain selection transistor DST is coupled to a drain selection line DSL.

In a NAND flash memory device, the memory cells of a memory cell block may be classified for every physical page or logical page. For example, the memory cells C0e1 to C0ek and C0o1 to C0ok coupled to the word line WL0 forms one physical page PAGE0. Furthermore, even-numbered memory cells C0e1 to C0ek coupled to the word line WL0 form one even physical page, and odd-numbered memory cells C0o1 to C0ok coupled to the word line WL0 form one odd physical page. The page or the even page and the odd page becomes a basic unit of the program operation or the read operation.

Referring to FIGS. 1 and 2, the control circuit 120 generates an internal command signal CMDi for performing the program operation, the read operation, or the test operation in response to a command signal CMD externally received through the I/O circuit 170 and generates PB control signals PB_SIGNALS for controlling the page buffers PB1 to PBk of the page buffer group 150 according to a kind of the operation. An operation of the control circuit 120 controlling the page buffer group 150 is described later.

The control circuit 120 generates a row address signal RADD and a column address signal CADD in response to an address signal ADD externally received via the I/O circuit 170. The row address signal RADD may include a global word line switch control signal GWL_SW_CON and a block selection signal BSEL.

The voltage supply circuit (130, 140) supplies operating voltages (for example, Vpgm, Vread, Vpass1, Vpass2, and Veq) necessary for the program operation, the read operation, and the test operation of the memory cells to local lines, including the drain selection line DSL, the word lines WL0 to WLn, and the source selection line SSL of a selected memory cell block in response to the internal command signal CMDi of the control circuit 120. The voltage supply circuit includes a voltage generator 130 and a row decoder 140. The voltage generator 130 supplies operating voltages (for example, Vpgm, Vread, Vpass1, Vpass2, and Veq) necessary for the program operation, the read operation, or the test operation of memory cells to global lines in response to the internal command signal CMDi of the control circuit 120.

In the program operation, the voltage generator 130 may output the program voltage Vpgm to the global lines to be supplied to the memory cells of a selected page, and the pass voltages Vpass1 and Vpass2 to be supplied to non-selected memory cells.

In the read operation, the voltage generator 130 may output the read voltage Vread to the global lines to be supplied to the memory cells of a selected page and the pass voltages Vpass1 and Vpass2 to be supplied to non-selected memory cells.

In the test operation related to data storage, as in the program operation, the voltage generator 130 may generate the program voltage Vpgm and the pass voltage Vpass. In the test operation related to data reading, as in the read operation, the voltage generator 130 may generate the read voltage Vread and the pass voltages Vpass1 and Vpass2. In addition, in the read operation, the voltage generator 130 may generate a predetermined voltage to all the word lines before a word line is discharged.

The row decoder 140 couples the global lines and the local lines DSL, WL0 to WLn, and SSL in response to the row address signals RADD of the control circuit 120 so that the operating voltages of the voltage generator 130 can be transferred from the memory array 110 to the local lines DSL, WL0 to WLn, and SSL of a selected memory cell block (for example, 110MB) via the global lines. Accordingly, the program voltage Vpgm or the read voltage Vread of the voltage generator 130 is supplied to a local word line (for example, WL0), coupled to a selected cell (for example, C0e1), via the global word lines. Furthermore, the pass voltages Vpass1 and Vpass2 of the voltage generator 130 are supplied to local word lines (for example, WL1 to WLn), coupled to non-selected cells C1e1 to Cne1 via the global word lines. In an erasure operation, the erase voltage Vera may be supplied to all the memory cells of a block. Accordingly, data is stored in the selected cell C0e1 in response to the program voltage Vpgm, or data stored in the selected cell C0e1 is read in response to the read voltage Vread.

In the word line discharge operation of the read operation, a ground voltage may be supplied to all the local word lines. Alternatively, before a local word line is discharged, a predetermined voltage may be supplied from the voltage generator 130 to all the local word lines via the global word lines.

Each of the page buffer groups 150 includes the plurality of page buffers PB1 to PBk coupled to the memory array 110 through the bit lines BLe1 to BLek and BLo1 to BLok. The page buffers PB1 to PBk selectively precharge the bit lines BLe1 to BLek or BLo1 to BLok according to data inputted in order to store the data in the memory cells C0e1 to C0ek or C0o1 to C0ok or senses the voltages of the bit lines BLe1 to BLek or BLo1 to BLok in order to read data from the memory cells C0e1 to C0ek or C0o1 to C0ok, in response to the PB control signal PB_SIGNALS of the control circuit 120.

For example, when program data (for example, '0') is inputted to the page buffer PB1 in order to store the program data in the memory cell C0e1, in a program operation, the page buffer PB1 supplies a program permission voltage (for example, a ground voltage) to the bit line BLe1 of the memory cell C0e1 in which the program data is stored. Consequently, the threshold voltage of the memory cell C0e1 is raised by the program voltage Vpgm supplied to the word line WL0 and the program permission voltage supplied to the bit line BLe1 in the program operation.

Furthermore, when erase data (for example, '1') is inputted to the page buffer PB1 in order to store the erase data in the memory cell C0e1, in a program operation, the page buffer PB1 supplies a program-inhibition voltage (for example, a power supply voltage) to the bit line BLe1 of the memory cell C0e1 in which the erase data is stored. Consequently, although the program voltage Vpgm is supplied to the word line WL0 in the program operation, the threshold voltage of the memory cell C0e1 is not raised by the program-inhibition voltage supplied to the bit line BLe1. Since the threshold voltage is varied, different data may be stored in the memory cell.

Meanwhile, in a read operation, the page buffer group 150 precharges all the selected bit lines (for example, BLe1 to BLek) of the even bit lines BLe1 to BLek and the odd bit lines BLo1 to BLok and discharges all the non-selected bit lines (for example, BLo1 to BLok). Furthermore, when the read voltage Vread is supplied from the voltage supply circuit (130 and 140) to a selected word line WL0, the bit lines of memory cells in which program data is stored maintain a precharge state. The bit lines of memory cells in which erase data is stored are discharged. The page buffer group 150 senses the voltages of the bit lines BLe1 to BLek and latch circuits the data of relevant memory cells corresponding to the result of the sense.

The page buffer is described later.

The column selection circuit 160 selects the page buffers PB1 to PBk of the page buffer group 150 in response to the column address signal CADD of the control circuit 120. That is, the column selection circuit 160 sequentially transfers data to be stored in memory cells to the page buffers PB1 to PBk in response to the column address signal CADD. Furthermore, the column selection circuit 160 sequentially selects the page buffers PB1 to PBk in response to the column address signal CADD so that the data of memory cells latched in the page buffers PB1 to PBk can be externally outputted according to a read operation.

The I/O circuit 170 transfers external data to the column selection circuit 160 under the control of the control circuit 120 so that the external data is inputted to the page buffer group 150 and then stored in memory cells in a program operation. When the data of the I/O circuit 170 is transferred to the page buffers PB1 to PBk of the page buffer group 150 according to the above method, the page buffers PB1 to PBk stores the inputted data in internals latch circuits. Furthermore, in a read operation, the I/O circuit 170 externally outputs the data received from the page buffers PB1 to PBk of the page buffer group 150 via the column selection circuit 160.

In a program verify operation performed after a program operation, the pass/fail check circuit 180 generates a pass/fail signal PF_SIGNAL in response to comparison result signals PF[1] to PF[k] outputted from the respective page buffers PB1 to PBk. More particularly, in the program verify operation, each of the threshold voltages of memory cells and a target voltage are compared, and resulting values are stored in the internal latch circuits of the page buffers PB1 to PBk. Next, the latched comparison result signals PF[1] to PF[k] are outputted to the pass/fail check circuit 180.

The pass/fail check circuit 180 outputs the pass/fail signal PF_SIGNAL, indicating whether a program operation has been completed, to the control circuit 120 in response to the comparison result signals PF[1] to PF[k]. In response to the pass/fail signal PF_SIGNAL, the control circuit 120 checks memory cells in which program data is stored to determine whether there is a memory cell that has a threshold voltage lower than the target voltage. The control circuit 120 then determines whether to perform the program operation again based on a result of the determination.

Figure 3:
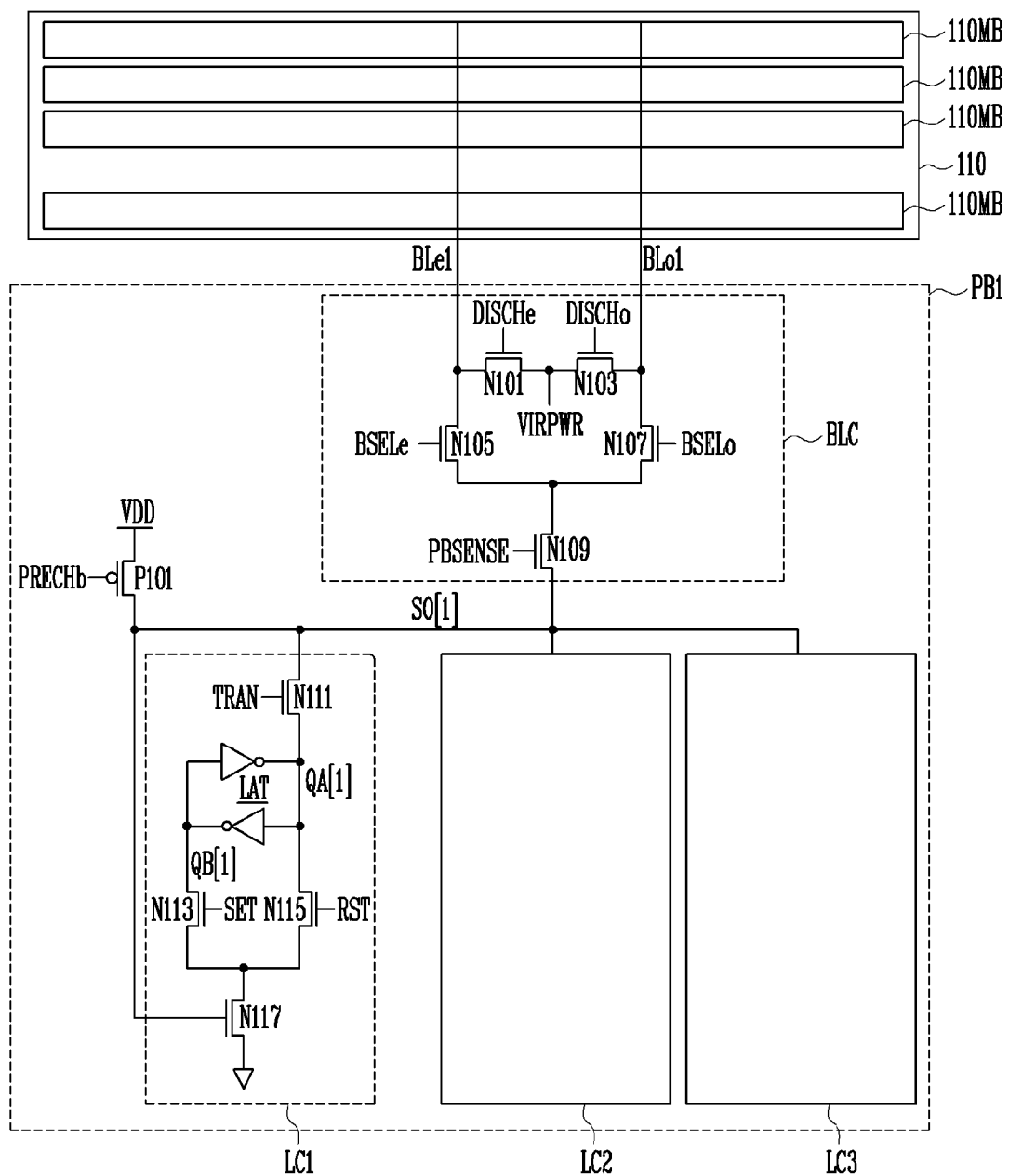
FIG. 3 is a circuit diagram illustrating a page buffer shown in FIG. 1.

FIG. 3 is a circuit diagram illustrating the page buffer shown in FIG. 1.

Referring to FIG. 3, the page buffer PB1 is operated under the control of the control circuit 120 of FIG. 1. The control circuit 120 may generate, for example, signals PRECHb, TRAN, RST, SET, PBSENSE, BLSe, BLSo, DISCHe, and DISCHo.

The page buffer PB1 includes a bit line connection circuit BLC, a precharge circuit P101, and a plurality of latch circuits LC1 to LC3.

The switching elements N105 and N107 of the bit line connection circuit BLC selects one of the even bit line BLe1 and the odd bit line BLo1 in response to the bit line selection signals BLSe and BLSo, respectively.

The switching elements N101 and N103 of the bit line connection circuit BLC precharge non-selected bit lines in a program operation or performs the discharge operation of the non-selected bit lines in a read operation, in response to the discharge signals DISCHe and DISCHo. The switching element N109 of the bit line connection circuit BLC performs an operation of connecting a bit line selected by the switching elements N105 and N107 and one of latch circuits 150L1 to 150L3 in response to a connection signal PBSENSE. The latch circuits LC1 to LC3 are coupled in parallel to each other, and in series with a switching element N109. A connection node of the switching element N109 and the latch circuits LC1 to LC3 becomes a sense node SO.

The precharge circuit P101 performs an operation of precharging the sense node SO in response to a precharge signal PRECHb.

The number of latch circuits LC1 to LC3 may be changed according to a design. An example in which the three latch circuits LC1 to LC3 are included in the page buffer is described. Only one of the latch circuits LC1 to LC3 is typically activated.

In a read operation, the first latch circuit LC1 latches data received from the column selection circuit 160 and transfers the received data to the second latch circuit LC2 or latches data read from memory cells and outputs the read data to the column selection circuit 160.

The second latch circuit LC2 may supply the program-inhibition voltage or the program permission voltage to a bit line in a program operation based on the data received from the first latch circuit LC1. Furthermore, the second latch circuit LC2 may latch data stored in memory cells and transfer the stored data to the first latch circuit LC1 in response to the voltage of a bit line in a read operation.

The third latch circuit LC3 may latch a comparison result of the threshold voltage of a memory cell and a target voltage and output a comparison result signal, corresponding to the comparison result, to the pass/fail check circuit 180, in a verify operation performed after the program operation.

The latch circuits include a plurality of switching elements and latches. The first latch circuit LC1 is described as an example.

The first latch circuit LC1 includes a latch LAT configured to latch data, a switching element N111 configured to couple the first node QA of the latch LAT and the sense node SO in response to a transmission signal TRAN, switching elements N113 and N115 coupled to the non-inverting terminal QA and the inverting terminal QB of the latch LAT, respectively, and operated in response to a set signal SET and a reset signal RST, respectively, and a switching element N117 coupled between the switching elements N113 and N115 and a ground terminal and operated in response to the voltage of the sense node SO.

Since signals having different waveforms are inputted to different latch circuits (for example, LC2 and LC3), only one of the latch circuits may be activated or the latch circuits may perform different functions although the latch circuits have the same configuration.

Figure 4:
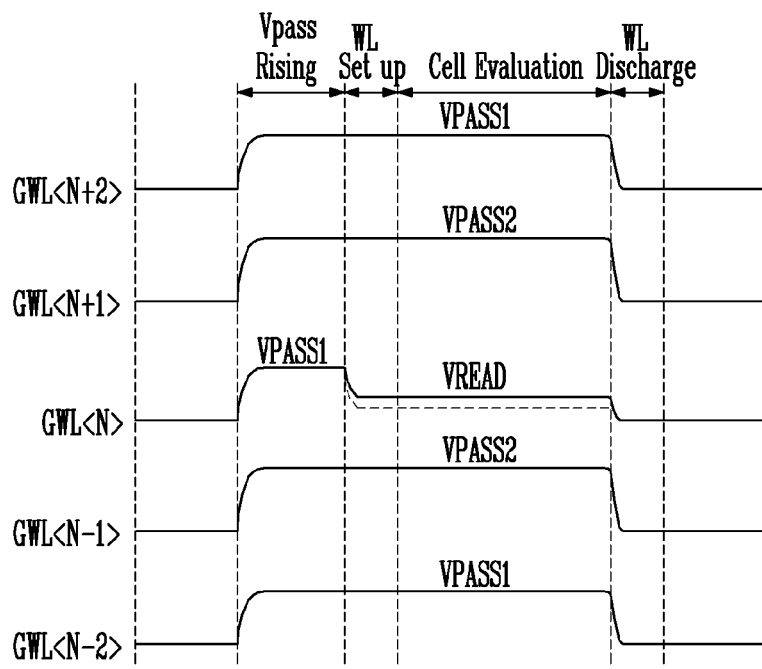
FIG. 4 is a timing diagram illustrating a method of operating the semiconductor memory device according to a first embodiment of this disclosure.

FIG. 4 is a timing diagram illustrating a method of operating the semiconductor memory device according to a first embodiment of this disclosure.

FIG. 4 shows that voltage waveforms are supplied to the global word lines GWL in a read operation or a verify operation.

In a common read operation or verify operation, a bit line is first precharged. Next, the read voltage VREAD or a verify voltage is supplied to a selected word line to which selected memory cells to be read or verified are coupled. Among all memory cells included in a cell string, the pass voltage VPASS is supplied to non-selected word lines to which the remaining memory cells other than the selected memory cells are coupled.

For reference, a specific voltage is supplied to the drain selection line and the source selection line. Next, connection between a page buffer and a bit line is cut off, and the source selection line is coupled to the ground. Next, an evaluation operation is performed for checking a change in the voltage of the bit line according to the threshold voltages of the selected memory cells. Next, the bit line and the page buffer are coupled again, and data stored in the selected memory cells according to the voltage of the bit line is sensed. Common read and verify operations, such as operations of sensing the voltage of the bit line through the page buffer after the precharge operation of the bit line or the evaluation operation of the selected memory cells are not related to this disclosure, and a detailed description is omitted.

Referring to FIG. 4, a selected voltage (for example, the read voltage VREAD) is supplied to a selected global word line (for example, GWL<N>), and non-selected voltages (for example, the pass voltages VPASS1 and VPASS2) are supplied to non-selected global word lines (for example, GWL<N−2>, GWL<N−1>, GWL<N+1>, and GWL<N+2>). To this end, in a VPASS rising step, the voltages of all the global word lines are raised up to a pass voltage.

More particularly, the second pass voltage VPASS2 is supplied to the global word lines GWL<N−1> and GWL<N+1> adjacent to the selected global word line GWL<N>, and the first pass voltage VPASS1 is supplied to the selected global word line GWL<N> and global word lines GWL<N−2> and GWL<N+2> that are not adjacent to the selected global word line GWL<N>. The first pass voltage VPASS1 may be lower than the second pass voltage VPASS2. The second pass voltage VPASS2 may be, for example, 7 V to 9 V.

Next, in a WL setup step, the voltage of the selected global word line GWL<N> is lowered from the first pass voltage VPASS1 to the read voltage VREAD. The read voltage VREAD may be equal to or higher than the ground voltage (indicated by a dotted line, for example, 0 V), and may be, for example 0 to 3 V.

Next, in a cell evaluation step, there is no change in the voltages of the global word lines, but there is a change in other portions such as, for example, on the source selection line side and the page buffer side coupled to the bit line. Accordingly, in FIG. 4, the voltage of the global word lines remains intact.

Finally, in a WL discharge step, the voltages of all the global word lines are discharged (for example, to 0 V).

Figure 5:
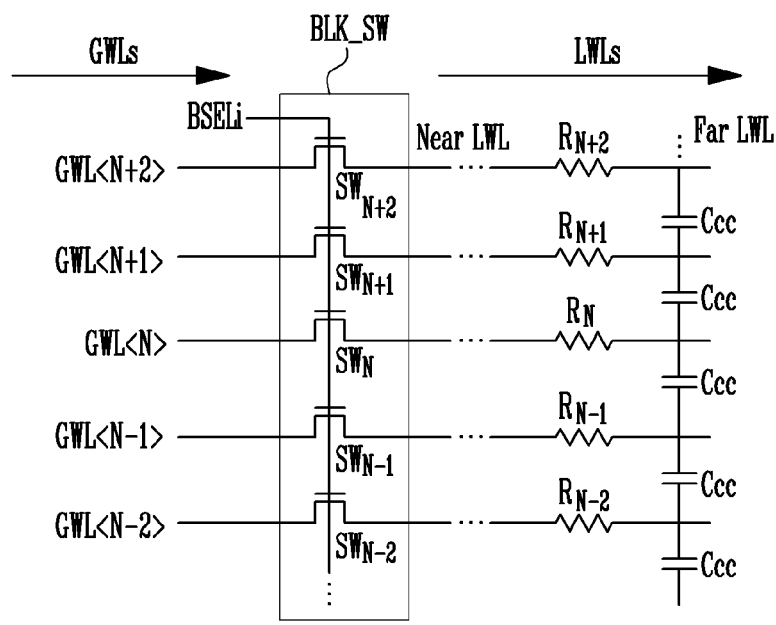
FIG. 5 is a circuit diagram illustrating capacitive coupling between word lines which is generated in the semiconductor memory device of FIG. 4.

FIG. 5 is a circuit diagram illustrating capacitive coupling between word lines, which is generated in the semiconductor memory device of FIG. 4.

Referring to FIG. 5, in the semiconductor memory device the global word lines GWLs in common coupled to several memory cell blocks are coupled to the local word lines LWLs through the block selection switch BLK_SW of a specific block. The block selection switch BLK_SW includes a plurality of pass transistors $SW_{n-2}$ to $SW_{n+2}$ and couples the global word lines GWLs and the local word lines LWLs in response to a block selection signal BSELi. The local word line LWL is formed of a gate layer that is very long and slim compared with the size of a relevant page buffer, and it has a high resistance value. Furthermore, since the interval between the local word lines is very narrow, the local word line LWL has a relatively high WL to WL capacitive coupling. The WL to WL capacitive coupling phenomenon increases from a local word (that is, a near LWL) close to the global word line to a local word line (that is, far LWL) far from the near LWL.

Figure 6:
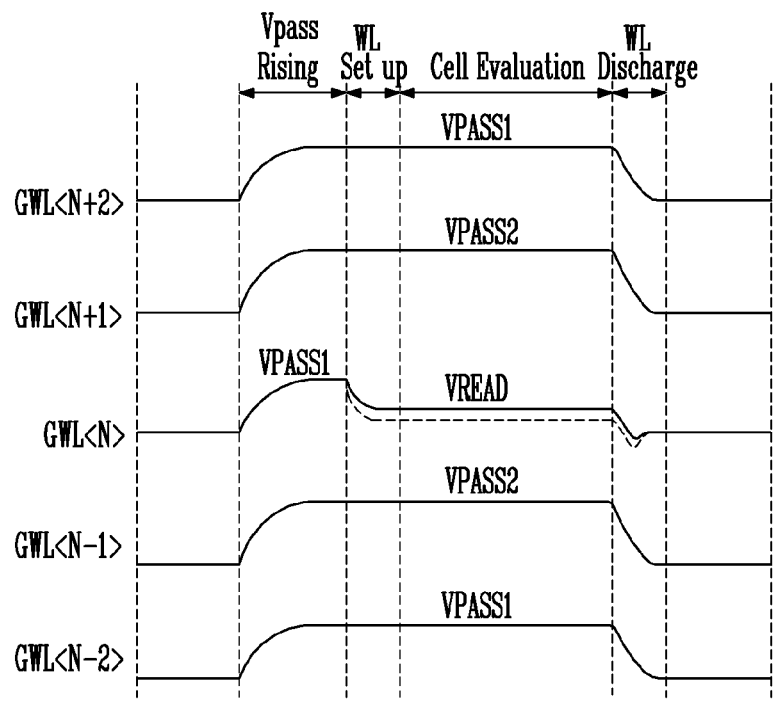
FIG. 6 is a timing diagram illustrating an influence of capacitive coupling on the WL discharge step of the method of operating the semiconductor memory device of FIG. 4.

FIG. 6 is a timing diagram illustrating an influence of capacitive coupling on the WL discharge step of the method of operating the semiconductor memory device shown in FIG. 4.

The capacitive coupling phenomenon described with reference to FIG. 5 influences the WL discharge step. The WL discharge step is described in more detail. In the precharge step of a program operation, voltages are transferred to the word lines in some order according to channel boosting. Even in a read operation, several voltages are transferred to the word lines by controlling the voltages before an actual read operation.

In the discharge step, however, all the word lines are discharged at the same time to a ground voltage or a very low voltage. The voltages of some word lines are not stably discharged to the ground voltage because of the influence of capacitive coupling between word lines as described above.

Referring to FIG. 6, prior to a WL discharge step, a selected global word line GWL<N> has the read voltage VREAD of, for example, 0 to 3 V, and non-selected word lines GWL<N−1> and GWL<N+1> adjacent to the selected global word line GWL<N> have the second pass voltage VPASS2 of, for example, 7 V to 9 V. In this state, if all the global word lines are discharged at the same time, non-selected local word lines coupled to the non-selected global word lines are slowly discharged due to RC delay, and the voltage of the selected local word line is quickly discharged to a minus voltage lower than 0 V due to capacitive coupling with the adjacent local word lines.

This phenomenon becomes more severe toward the side that is relatively far from the global word lines, as described above. That is, a difference in the voltage of the global word lines and the local word line is increased toward the side relatively far from the global word lines. This is because a voltage source may not be powerful enough to appropriately supply the local word lines relatively far from the global word lines.

Figure 7:
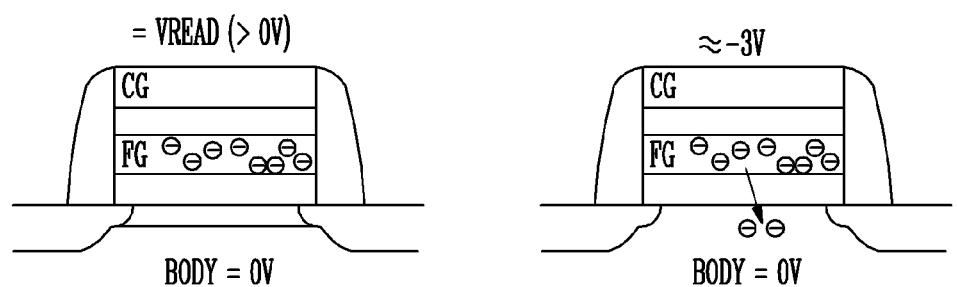
FIG. 7 is a diagram illustrating that a soft erasure condition is formed in the WL discharge step of the method of operating the semiconductor memory device of FIG. 4 because of capacitive coupling.
Figure 8:
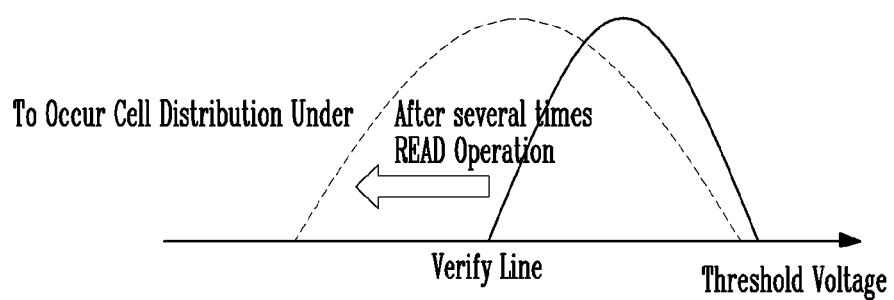
FIG. 8 is a diagram illustrating that a threshold voltage distribution shifts to the left because the soft erasure condition of FIG. 7 is formed.

FIG. 7 is a diagram illustrating that a soft erasure condition is formed in the WL discharge step of the method of operating the semiconductor memory device of FIG. 4 due to capacitive coupling. FIG. 8 is a diagram illustrating that a threshold voltage distribution shifts to the left because the soft erasure condition of FIG. 7 is formed.

Referring to FIG. 7, in a common read operation, the read voltage is supplied to the control gate of a selected memory cell, and a channel body has voltage of 0 V. As the WL capacitive coupling phenomenon described with reference to FIG. 6 becomes more severe (that is, a memory cell far from the global word lines is selected), the word line has a greater minus voltage in the WL discharge step. Hence a greater minus voltage is supplied to the control gate of the memory cell. Note that for this limited description, if voltage X is said to have a greater minus voltage than voltage Y, then the absolute value of the minus voltage X is larger than the absolute value of minus voltage Y.

In a read operation, the channel body has a low plus voltage that may be, for example, 0 V. Accordingly, the memory cell has an erasure condition, and thus electrons stored in the floating gate of the memory cell are discharged toward the channel body (or holes are injected into the channel body). This phenomenon has a very low erasure effect as compared with a common erasure operation, but may have an effect on a threshold voltage distribution if the read operation is repeated several times. Accordingly, if the read operation is repeated several thousands or tens of thousands of times, it may influence a threshold voltage distribution.

From FIG. 8, it can be seen that as a result of several read operations, the threshold voltage distribution of memory cells has shifted toward the left.

As described above, in the WL discharge step of a read or verify operation, a selected word line instantly has a minus voltage owing to the WL capacitive coupling phenomenon, with the result that a soft erasure condition is formed. Accordingly, there is a problem in that the threshold voltage distribution of memory cells is shifted. A semiconductor memory device and a method of operating the same to solve the above problem are described below.

Figure 9:
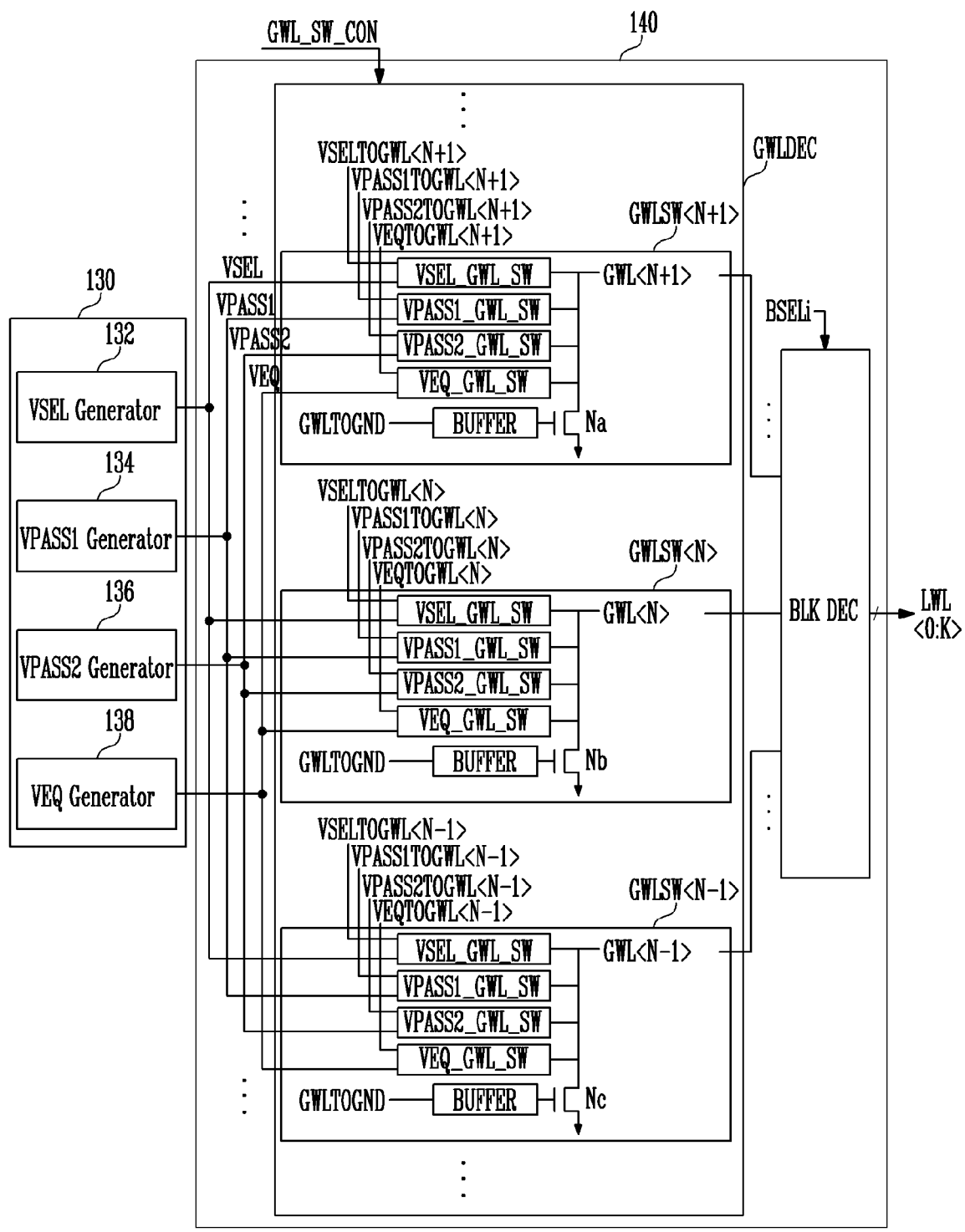
FIG. 9 is a detailed block diagram illustrating an exemplary connection relationship between a row decoder and the voltage generator of the semiconductor memory device shown in FIG. 1 according to an embodiment of the invention.

FIG. 9 is a detailed block diagram illustrating a connection relationship between the row decoder and the voltage generator of the semiconductor memory device shown in FIG. 1.

A voltage generator 130 includes a selected voltage generator 132 for generating a selected voltage VSEL, a first pass voltage generator 134 for generating a first pass voltage VPASS1, a second pass voltage generator 136 for generating a second pass voltage VPASS2, and an equalizing voltage generator 138 for generating a predetermined voltage that may be, for example, an equalizing voltage VEQ.

In FIG. 9, the voltage generator 130 is illustrated to include the four sub-voltage generators 132, 134, 136, and 138. However, the number of sub-voltage generators is illustrative, and does not limit the invention.

The row decoder 140 includes a global word line decoder GWLDEC and a block decoder BLK DEC. In FIG. 9, the global word line decoder GWLDEC is illustrated to be included in the row decoder 140, but may be included in the voltage generator 130 according to various embodiments.

The global word line decoder GWLDEC includes a plurality of global word line switching units GWLSW<n>. In FIG. 9, the global word line switching units is illustrated to include, for example, an $(N-1)^{th}$ global word line switching unit GWLSW<N-1>, an $N^{th}$ global word line switching unit GWLSW<N>, and an $(N+1)^{th}$ global word line switching unit GWLSW<N+1>.

The global word line switching unit GWLSW<N> includes a plurality of global word line switches and a ground connection circuit Nb. The global word line switching unit GWLSW<N> is coupled to the selected voltage generator 132, the first pass voltage generator 134, the second pass voltage generator 136, and the equalizing voltage generator 138. The global word line switching unit GWLSW<N> transfers the selected voltage VSEL, the first pass voltage VPASS1, the second pass voltage VPASS2, and the equalizing voltage VEQ to an appropriate global word line GWL<N> in response to the control signal GWL_SW_CON of the control circuit 120.

More particularly, the first global word line switch VSEL_GWL_SW<N> of the global word line switching unit GWLSW<N> transfers the selected voltage VSEL to the global word line GWL<N> in response to a first global word line switch control signal (or a selected voltage transfer signal VSELTOGWL<N>). The second global word line switch VPASS1_GWL_SW<N> of the global word line switching unit GWLSW<N> transfers the first pass voltage VPASS1 to the global word line GWL<N> in response to a second global word line switch control signal (or a first pass voltage transfer signal VPASS1TOGWL<N>). The third global word line switch VPASS2_GWL_SW of the global word line switching unit GWLSW<N> transfers the second pass voltage VPASS2 to the global word line GWL<N> in response to a third global word line switch control signal (or a second pass voltage transfer signal VPASS2TOGWL<N>). The fourth global word line switch VEQ_GWL_SW of the global word line switching unit GWLSW<N> transfers the equalizing voltage VEQ to the global word line GWL<N> in response to a fourth global word line switch control signal (or an equalizing voltage transfer signal VEQTOGWL<N>).

In FIG. 9, one control signal is illustrated to be inputted from the control circuit to the global word line decoder GWLDEC, but this is for the sake of convenience. Different control signals are inputted to the global word line switches VSEL_GWL_SW, VPASS1_GWL_SW, VPASS2_GWL_SW, and VEQ_GWL_SW of the global word line switching unit. It is to be noted that the control signals are shown as one control signal GWL_SW_CON, for the sake of convenience. In an embodiment of the invention, each of the global word line switches may be implemented using an NMOS transistor. The NMOS transistors may be configured to receive respective control signals through their gates and to output relevant voltages to the global word line.

The global word line switching unit GWLSW<N> includes the ground connection circuit Nb. The ground connection circuit Nb may be implemented using an NMOS transistor coupled between the ground terminal and the relevant global word line GWL<N>. The ground connection circuit Nb may discharge the global word line GWL<N> by coupling the relevant global word line GWL<N> to the ground in response to the ground connection signal GWLTOGND of the control circuit 120.

In an embodiment of the invention, the ground connection circuits of the respective global word line switching units may discharge the global word lines at the same time in response to the same ground connection signal GWLTOGND or may discharge relevant global word lines in response to different ground connection signals. In order to delay the timing of the ground connection signal GWLTOGND inputted to the ground connection circuit Nb, the ground connection signal GWLTOGND may be inputted to the ground connection circuit Nb via a buffer circuit BUFFER<N>. In this case, the ground connection signal GWLTOGND can be prevented from becoming weak when the ground connection signal GWLTOGND is received from far away, and an accurate voltage can be inputted to the gate of the ground connection circuit Nb. The buffer circuit BUFFER may be implemented in the form of an even-numbered inverter chain.

The block decoder BLK DEC couples the global word lines to the local word lines of a memory cell block, selected from among a plurality of memory cell blocks, in response to the block selection signal BSELi.

A method of operating the semiconductor memory device having the above construction is described below.

Figure 10:
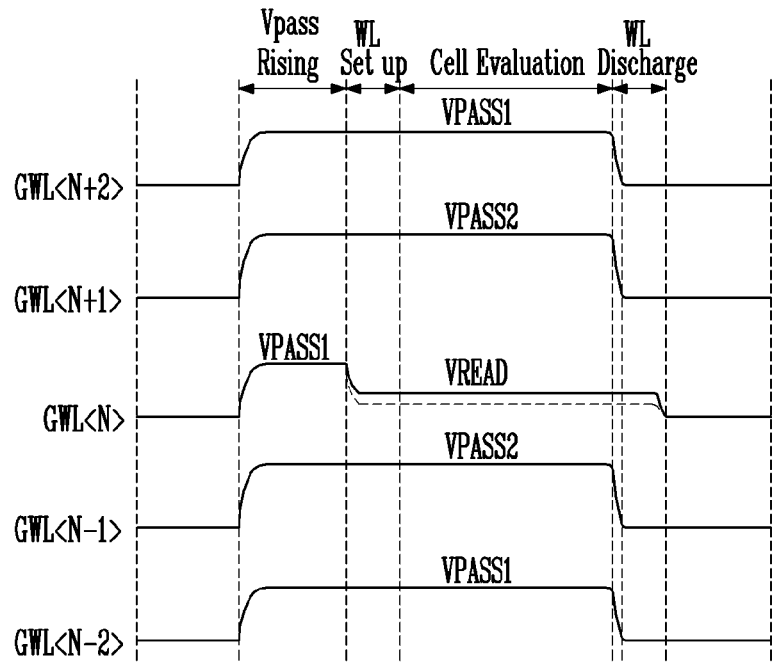
FIG. 10 is a timing diagram illustrating an exemplary method of operating the semiconductor memory device according to a second embodiment of this disclosure.

FIG. 10 is a timing diagram illustrating the method of operating the semiconductor memory device according to a second embodiment of this disclosure.

Five global word lines are illustrated in FIG. 10, but the number of global word lines is not limited to 5.

Referring to FIGS. 9 and 10, the read voltage VREAD (that is, the selected voltage VSEL) is supplied to the selected global word line GWL<N>, and the non-selected voltages (that is, the pass voltage VPASS1 and VPASS2) are supplied to the non-selected global word lines GWL<N-2>, GWL<N-1>, GWL<N+1>, and GWL<N+2>. To this end, the voltages of all the global word lines are raised up to a pass voltage.

More particularly, the third global word line switch VPASS2_GWL_SW of the global word line switching unit of each of the global word lines GWL<N-1> and GWL<N+1> adjacent to the selected global word line GWL<N> is turned on in response to a control signal. The second pass voltage VPASS2 is supplied to the global word lines GWL<N-1> and GWL<N+1> adjacent to the selected global word line GWL<N>. The second global word line switch VPASS1_GWL_SW of the global word line switching unit of the selected global word line GWL<N> and the global word lines GWL<N-2> and GWL<N+2> not adjacent to the selected global word line GWL<N> are turned on in response to a control signal, and the first pass voltage VPASS1 is supplied to the selected global word line GWL<N> and the global word lines GWL<N-2> and GWL<N+2> not adjacent to the selected global word line GWL<N>. The first pass voltage VPASS1 may be lower than the second pass voltage VPASS2. The second pass voltage VPASS2 may be, for example, 7 V to 9 V.

Next, in a WL setup step, the first global word line switch VSEL_GWL_SW of the global word line switching unit GWL_SW<N> of the selected global word line GWL<N> is turned on and the second global word line switch VPASS1_GWL_SW is turned off in response to a control signal so that the voltage of the selected global word line GWL<N> is lowered from the first pass voltage VPASS1 to the selected voltage VSEL (that is, the read voltage VREAD). Here, the read voltage VREAD may be equal to or higher than, for example, a ground voltage (indicated by a dotted line, for example, 0 V). The read voltage VREAD may be, for example, from 0 to 3V.

Next, in a cell evaluation step, there is no change in the voltage of the global word lines, but there is a change in other portions (for example, on the source selection line side and the page buffer side coupled to a bit line). Accordingly, in FIG. 10, the voltages of the global word lines remain intact.

Finally, in a WL discharge step, the voltages of all the global word lines are discharged (for example, to 0 V).

In the method of operating the semiconductor memory device according to the second embodiment of this disclosure, in the WL discharge step the non-selected global word lines GWL<N−2>, GWL<N−1>, GWL<N+1>, and GWL<N+2> are discharged and, after a lapse of some time, the selected global word line GWL<N> is discharged. That is, after adjacent non-selected global word lines are discharged to some extent in a first discharge section, the selected global word line is discharged in a second discharge section. Two kinds of methods for implementing the above description are described below.

According to the first method, in the first discharge section, the ground connection circuits of the global word line switching units GWLSW<N−2>, GWLSW<N−1>, GWLSW<N+1>, and GWLSW<N+2> of the non-selected global word lines GWL<N−2>, GWL<N−1>, GWL<N+1>, and GWL<N+2> are turned on in response to the ground connection signal GWLTOGND. In the second discharge section after a lapse of some time, the ground connection circuit of the selected global word line switching unit GWLSW<N> is turned on, thereby discharging the selected global word line GWL<N>. This method may be implemented by separately controlling the ground connection signal GWLTOGND for turning on the ground connection circuit of each global word line switching unit.

According to the second method, in the first discharge section, the first or second global word line switch VPASS1_GWL_SW or VPASS2_GWL_SW of the global word line switching units GWLSW<N−2>, GWLSW<N−1>, GWLSW<N+1>, and GWLSW<N+2> of the non-selected global word lines GWL<N−2>, GWL<N−1>, GWL<N+1>, and GWL<N+2> is turned off, so that the first or second pass voltage VPASS1 or VPASS2 supplied to the non-selected global word lines GWL<N−2>, GWL<N−1>, GWL<N+1>, and GWL<N+2> is blocked. More particularly, the first or second pass voltage VPASS1 or VPASS2 is discharged to the ground voltage. In the second discharge section after a lapse of some time, the ground connection circuits of all the global word line switching units are turned on, thereby discharging all the global word lines.

In order to block the first or second pass voltage VPASS1 or VPASS2 supplied to the non-selected global word lines GWL<N−2>, GWL<N−1>, GWL<N+1>, and GWL<N+2>, a method of turning off the first or second global word line switch VPASS1_GWL_SW or VPASS2_GWL_SW of the non-selected global word line switching units GWLSW<N−2>, GWLSW<N−1>, GWLSW<N+1>, and GWLSW<N+2> is used. However, in the first pass voltage generator 134 and the second pass voltage generator 136 of the voltage generator 130 in front of the global word line decoder GWLDEC, the generation of the first pass voltage VPASS1 and the second pass voltage VPASS2 may be blocked (that is, connected to the ground). In this case, the first or second global word line switch VPASS1_GWL_SW or VPASS2_GWL_SW of the non-selected global word line switching units GWLSW<N−2>, GWLSW<N−1>, GWLSW<N+1>, and GWLSW<N+2> need not be turned off.

In an embodiment, the discharging timings of non-selected word lines and a selected word line are separated from each other. In the state in which the voltage of the selected word line remains high at a point of time when coupling is generated, voltage is transferred to the local word line through the global word line. Accordingly, the amount of voltage undershoot due to coupling can be reduced.

Figure 11:
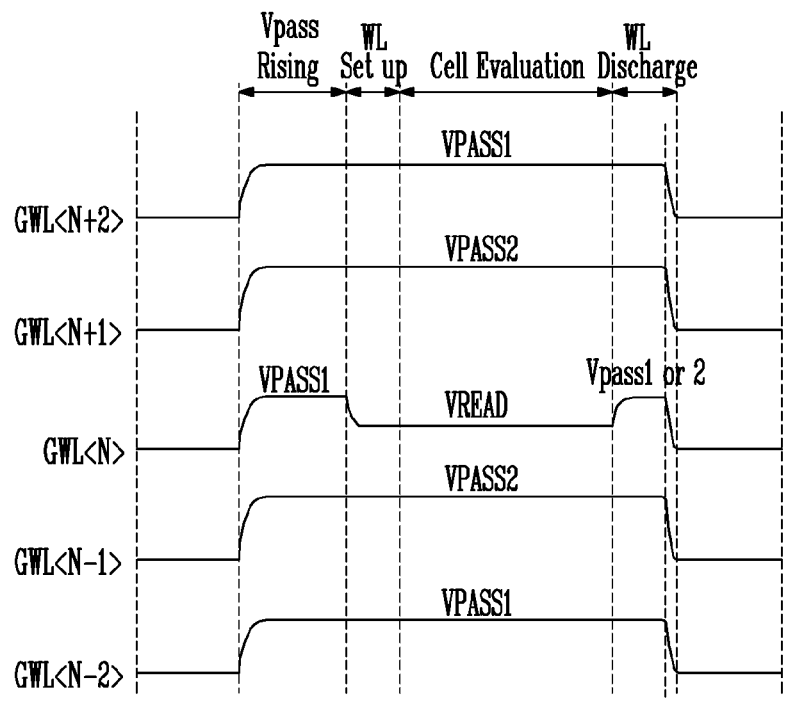
FIG. 11 is a timing diagram illustrating an exemplary method of operating the semiconductor memory device according to a third embodiment of this disclosure.

FIG. 11 is a timing diagram illustrating a method of operating the semiconductor memory device according to a third embodiment of this disclosure.

A VPASS rising step, a WL setup step, and a cell evaluation step are the same as those of the method of operating the semiconductor memory device according to the second embodiment of this disclosure was described above with reference to FIGS. 9 and 10, that description is omitted.

Referring to FIGS. 9 and 11, in the WL discharge step of the method of operating the semiconductor memory device according to the third embodiment of this disclosure, before all the global word lines are discharged, the voltage of a selected word line GWL<N> may be raised up to the first or second pass voltage VPASS1 or VPASS2 (that is, the voltages of non-selected word lines). All the global word lines are discharged.

In a first discharge section, the second or third global word line switch VPASS1_GWL_SW or VPASS2_GWL_SW of the global word line switching unit GWLSW<N> of the selected global word line GWL<N> is turned on, so that the voltage of the selected word line GWL<N> is raised up to the first or second pass voltage VPASS1 or VPASS2. Next, in a second discharge section, the ground connection circuits of all the global word line switching units are turned on in response to the ground connection signal GWLTOGND, thereby discharging all the global word lines. Here, the ground connection signal GWLTOGND may be used in common in all the global word line switching units.

In a present embodiment, during the time for which the word lines are discharged, a selected word line has the same potential as adjacent to non-selected word lines and thus a capacitive coupling phenomenon is not generated. Furthermore, the word lines can be safely discharged because the same discharge path is used and thus there is no difference in the discharge speed between the word lines.

FIG. 12 is a timing diagram illustrating a method of operating the semiconductor memory device according to a fourth embodiment of this disclosure.

A VPASS rising step, a WL setup step, and a cell evaluation step are the same as those of the method of operating the semiconductor memory device according to the second and the third embodiments of this disclosure described above with reference to FIG. 9, and, therefore, the redundant description is omitted.

Referring to FIGS. 9 and 12, according to the method of operating the semiconductor memory device according to the fourth embodiment of this disclosure, in the WL discharge step, before all the global word lines are discharged, the voltages of all the global word lines are changed (that is, equalized) to a predetermined voltage (that is, the equalizing voltage VEQ) in a first discharge section. In a second discharge section, all the global word lines are discharged.

The equalizing voltage VEQ has an intermediate value between the highest voltage and the lowest voltage, from among voltages used in the operation of the semiconductor memory device. The lowest voltage is about 0 V. Two kinds of methods of changing the voltages of all the global word lines into the equalizing voltage VEQ are described below.

According to the first method, after a read operation is finished, in a WL discharge step, the second and the third global word line switches VPASS1_GWL_SW and VPASS2_GWL_SW of all the global word line switching units are turned off, and the fourth global word line switches VEQ_GWL_SW are turned on. Accordingly, the equalizing voltage VEQ from the equalizing voltage generator 138 of the voltage generator 110 is transferred to all the global word lines.

After the voltages of all the global word lines have the equalizing voltage VEQ, the ground connection circuits of all the global word line switching units are turned on in response to the ground connection signal GWLTOGND, thereby discharging all the global word lines to the ground voltage 0 V at the same time. The ground connection signal GWLTOGND may be used in common in all the global word line switching units.

According to the second method, the voltages of all the global word lines are changed to the equalizing voltage VEQ without using an additional voltage source, such as the equalizing voltage generator 138.

As described above, the equalizing voltage VEQ has an intermediate value between the highest voltage and the lowest voltage, from among voltages used in the operation of the semiconductor memory device. Thus, the equalizing voltage VEQ may be lower than the first or second pass voltage VPASS1 or VPASS2, but higher than the selected voltage VSEL (that is, the read voltage VREAD). All the global word lines may be interconnected by the fourth global word line switches VEQ_GWL_SW of the global word line switching units.

Although an additional voltage source, such as the equalizing voltage generator 138, is not used, if the second and the third global word line switches VPASS1_GWL_SW and VPASS2_GWL_SW of all the global word line switching units are turned off and the fourth global word line switches VEQ_GWL_SW are turned on, the voltages of all the global word lines may be changed into the equalizing voltage VEQ which is higher than the read voltage VREAD, but lower than the first or second pass voltage VPASS1 or VPASS2 because electric charges are shared.

After the voltages of all the global word lines become the equalizing voltage VEQ, the ground connection circuits of all the global word line switching units are turned on in response to the ground connection signal GWLTOGND, thereby discharging all the global word lines to the at 0 V ground voltage at the same time. The ground connection signal GWLTOGND may be used in common in all the global word line switching units.

This method is similar to the method of the third embodiment described with reference to FIG. 10. In the third embodiment, timing may be added in order to raise the voltage of a selected word line to the pass voltage. In this method, however, the voltages of non-selected word lines may be lowered to a first level and the voltage of a selected word line is raised to the first level. Accordingly, there is an advantage in that the additional time needed can be minimized.

In the exemplary embodiments of this disclosure, in the discharge operation of a word line during a read or verify operation a coupling effect between word lines is reduced or offset. Accordingly, an adverse reaction, such as soft erasure or hole injection that may be generated due to coupling, can be prevented or alleviated.

Accordingly, a shift in the threshold voltage distribution of memory cells due to a soft erasure condition in the word line discharge operation can be effectively prevented. In particular, reliability of the semiconductor memory device can be improved because a change in the threshold voltage distribution of memory cells that may be generated when many read operations are performed is prevented.

The exemplary embodiments of this disclosure may be used to improve reliability of a semiconductor memory device including memory cells using a different in the electric field.

The exemplary embodiments of this disclosure may also be implemented using a program for realizing functions corresponding to the construction of the exemplary embodiment of this disclosure using a storage medium where the program is stored. The program may be executed by a controller, processor, state machine, etc. The implementations may be readily realized by a person having ordinary skill in the art from the description of the exemplary embodiments.

What is claimed is:

1. A method of operating a semiconductor memory device, comprising:
applying a read voltage to a selected word line to which a selected memory cell is coupled and applying a pass voltage to non-selected word lines to which non-selected memory cells are coupled;
reading data stored in the selected memory cell by sensing a voltage of a bit line associated with the selected memory cell and the non-selected memory cells;
applying a predetermined voltage to all of the word lines; and
discharging all the word lines at the same time after voltages of all word lines are changed to the predetermined voltage,
wherein the predetermined voltage is higher than the read voltage, but lower than the pass voltage.

2. The method of claim 1,
wherein the applying a pass voltage to non-selected word lines comprises:
applying a second pass voltage to non-selected word lines adjacent to the selected word line, and
applying a first pass voltage lower than the second pass voltage to non-selected word lines not adjacent to the selected word line.

3. The method of claim 2,
wherein the applying a read voltage to the selected word line comprises:
supplying the first pass voltage to the selected word line, and
changing the voltage of the selected word line to the read voltage.

4. The method of claim 1, further comprising,
interconnecting all the word lines before discharging all the word lines in order to change voltages of the word lines to the predetermined voltage.

5. A semiconductor memory device, comprising:
memory cell blocks comprising a plurality of memory cells;
a voltage supply circuit configured to supply a selected voltage to a selected global word line to which a selected memory cell of the memory cells is coupled, to supply a non-selected voltage to non-selected global word lines to which non-selected memory cells of the memory cells are coupled in a read operation, and to supply a ground voltage to all the global word lines in a word line discharge operation, in response to control signals; and a control circuit configured to control the voltage supply circuit by generating the control signals, wherein the control circuit controls the voltage supply circuit so that all the global word lines are discharged at the same time after voltages applied to all of the global word lines are changed to a predetermined voltage in the word line discharge operation, and wherein the predetermined voltage is higher than the read voltage, but lower than the pass voltage.

6. The semiconductor memory device of claim 5, wherein the voltage supply circuit is configured to: supply a second pass voltage to global word lines adjacent to the selected global word line, and supply a first pass voltage lower than the second pass voltage to global word lines not adjacent to the selected global word line.

7. The semiconductor memory device of claim 6, wherein the voltage supply circuit comprises:

a voltage generator configured to generate the selected voltage, the first pass voltage, the second pass voltage, and the predetermined voltage; and a global word line decoder comprising a plurality of global word line switching units for transferring the selected voltage, the first pass voltage, the second pass voltage, the predetermined voltage, or the ground voltage to a relevant global word line in response to global word line switch control signals.

8. The semiconductor memory device of claim 7, wherein the voltage supply circuit further comprises a block decoder configured to couple the global word lines to local word lines of a memory cell block in response to a block selection signal.

9. The semiconductor memory device of claim 7, wherein each of the global word line switching units comprises:

a first global word line switch for transferring the selected voltage to the relevant global word line in response to a first global word line switch control signal;

a second global word line switch for transferring the first pass voltage to the relevant global word line in response to a second global word line switch control signal;

a third global word line switch for transferring the second pass voltage to the relevant global word line in response to a third global word line switch control signal;

a fourth global word line switch for transferring the predetermined voltage to the relevant global word line in response to a fourth global word line switch control signal; and a ground connection circuit for supplying the ground voltage to the relevant global word line in response to a ground connection signal.

10. The semiconductor memory device of claim 6, wherein the voltage supply circuit comprises:

a voltage generator configured to generate the selected voltage, the first pass voltage, or the second pass voltage; and a global word line decoder configured to comprise a plurality of global word line switching units for transferring the selected voltage, the first pass voltage, the second pass voltage, or the ground voltage to a relevant global word line or coupling the relevant global word line to other global word lines in response to global word line switch control signals.

11. The semiconductor memory device of claim 10, wherein each of the global word line switching units comprises:

a first global word line switch for transferring the selected voltage to the relevant global word line in response to a first global word line switch control signal;

a second global word line switch for transferring the first pass voltage to the relevant global word line in response to a second global word line switch control signal;

a third global word line switch for transferring the second pass voltage to the relevant global word line in response to a third global word line switch control signal;

a fourth global word line switch for coupling the relevant global word line to other global word lines in response to a fourth global word line switch control signal; and a ground connection circuit for supplying the ground voltage to the relevant global word line in response to a ground connection signal.

12. A semiconductor memory device, comprising:

a memory array comprising a plurality of memory cells coupled to a plurality of word lines;

a voltage supply circuit configured to apply a read voltage to a selected word line and a pass voltage to non-selected word lines at a first timing during a read operation of the memory cells; and a discharge circuit configured to discharge all the word lines at the same time at a second timing during the read operation, wherein, the voltage supply circuit applies a predetermined voltage to the selected word line between the first timing and the second timing so that the voltage applied to all of the word lines is raised up to the predetermined voltage at the second timing, and wherein the predetermined voltage is higher than the read voltage, but lower than the pass voltage.

* * * * *